United States Patent [19]

Maejima et al.

[11] Patent Number: 5,333,282
[45] Date of Patent: Jul. 26, 1994

[54] SEMICONDUCTOR INTEGRATED CIRCUIT DEVICE WITH AT LEAST ONE BIPOLAR TRANSISTOR ARRANGED TO PROVIDE A DIRECT CONNECTION BETWEEN A PLURALITY OF MOSFETS

[75] Inventors: Hideo Maejima; Ikuro Masuda, both of Hitachi, Japan

[73] Assignee: Hitachi, Ltd., Tokyo, Japan

[21] Appl. No.: 771,834

[22] Filed: Oct. 8, 1991

Related U.S. Application Data

[60] Continuation of Ser. No. 622,499, Dec. 5, 1990, abandoned, which is a continuation of Ser. No. 155,484, Feb. 12, 1988, Pat. No. 5,005,153, which is a division of Ser. No. 13,204, Feb. 6, 1987, abandoned, which is a continuation of Ser. No. 535,054, Sep. 23, 1983, abandoned.

[30] Foreign Application Priority Data

Sep. 29, 1982 [JP] Japan .................................. 57-168502
Oct. 27, 1982 [JP] Japan .................................. 57-187569

[51] Int. Cl.⁵ .............................................. C06F 13/00
[52] U.S. Cl. .................................. 395/375; 395/800; 364/DIG. 2; 364/925.5; 364/927.8; 364/925.6; 364/926.1; 307/446; 257/378
[58] Field of Search .............. 395/800, 775, 375, 250; 357/43; 307/446

[56] References Cited

U.S. PATENT DOCUMENTS

| | | | |
|---|---|---|---|
| 3,865,649 | 2/1975 | Beasom | 357/43 |
| 3,987,418 | 9/1976 | Buchanan | 364/200 |
| 4,144,561 | 3/1979 | Tu et al. | 364/200 |
| 4,153,933 | 5/1979 | Blume, Jr. et al. | 364/200 |
| 4,225,877 | 9/1980 | Miles et al. | 357/41 |
| 4,266,270 | 5/1981 | Daniels et al. | 364/200 |
| 4,307,445 | 12/1981 | Tredennick et al. | 364/200 |
| 4,366,522 | 12/1982 | Baker | 361/91 |
| 4,402,003 | 8/1983 | Blanchard | 357/43 |
| 4,425,516 | 1/1984 | Wanlass | 307/446 |
| 4,433,378 | 2/1984 | Leger | 364/200 |
| 4,441,117 | 4/1984 | Zommer | 357/43 |
| 4,450,519 | 5/1984 | Guttag et al. | 364/200 |
| 4,525,639 | 6/1985 | Nonaka | 307/446 |
| 4,547,791 | 10/1985 | Koger et al. | 357/43 |

Primary Examiner—Kevin A. Kriess
Attorney, Agent, or Firm—Antonelli, Terry, Stout & Kraus

[57] ABSTRACT

In a semiconductor integrated circuit device having at least two logic blocks each including at least two logic units each having a number of MOS FET's integrated therein, bipolar transistors for driving the MOS FET's are selectively arranged between the logic blocks and/or the logic units so as to shorten the critical path of a logic block.

65 Claims, 13 Drawing Sheets

SEMICONDUCTOR INTEGRATED CIRCUIT DEVICE WITH AT LEAST ONE BIPOLAR TRANSISTOR ARRANGED TO PROVIDE A DIRECT CONNECTION BETWEEN A PLURALITY OF MOSFETS

This is a continuation of application Ser. No. 07/622,499, filed Dec. 5, 1990, now abandoned, which is a continuation of application Ser. No. 07/155,484, filed Dec. 12, 1988, now U.S. Pat. No. 5,005,153, which is a division of application Ser. No. 07/013,204, filed Feb. 6, 1987, now abandoned, which is a continuation of application Ser. No. 06/535,054, filed Sep. 23, 1983, now abandoned.

The present invention relates to a semiconductor integrated circuit device, and more particularly to a semiconductor integrated circuit device suitable to a high density and high speed logic large scale integration.

The advancement in semiconductor technology in recent years is remarkable, particularly in a field of MOS (metal oxide semiconductor). As the MOS technology has been developed, small scaling of devices has been accelerated and many circuits can be integrated on a silicon chip of several milimeters square.

However, as the integration density of the LSI increases by the improvement of the MOS technology, a plurality of logic blocks each comprising a number of MOS field effect transistors can be formed on one silicon chip. In coupling the logic blocks on the chip, a capacitive load increases, which results in the decrease of a signal transmission rate. A cause of the increase of the capacitive load resides in the use of a number of MOS field effect transistors which are voltage devices. Thus, a weak point of the MOS field effect transistors appears.

FIG. 1 shows a configuration of a one-chip microcomputer which is a typical example of a highly integrated logic LSI. The LSI which forms the microcomputer 100 has logic blocks such as a ROM (read-only memory) 112, a RAM (random access memory) 113, a processor 114, a timer 115 and a peripheral circuit 116 arranged inside of input/output buffers 111 arranged in an outer periphery of a chip and interconnected through an internal bus 117. While not shown, a clock circuit is also one of the logic blocks. As the respective elements are highly integrated and a circuit scale of each element increases, a large number of MOS field effect transistors are integrated. As a result, the following problems occur.

One of the problems is the increase of signal transmission delay in each logic block. As the integration densities of the ROM 112 and the RAM 113 increase, the total number of bits of the memory naturally increases. An example of a high integration memory is explained below for the ROM 112.

FIG. 2 shows a block diagram of the ROM 112 which is one of the logic blocks of the microcomputer shown in FIG. 1. The ROM 112 comprises address input buffers 10, word drivers 12, multiplexer and sense circuits 15, which serve as coupling circuits, and an address decoder 11 and memory cells 13 which serve as logic units. Those coupling circuits and the logic units are interconnected through an address input bus 118, an address buffer output bus 120, a decoder output bus 122 and buses through which word signals 124, bit signals 126 and data outputs 128 are transmitted.

In the prior art device, those coupling circuits are formed by the MOS field effect transistors. As the total number of bits of the ROM 112 increases, sizes of arrays of the address decoder 11 and the memory cells 13 increase. As a result, a load of the address input buffers 10 which drive the address decoder 11 and a load of the word drivers 12 which drive the memory cells 13 increase, which results in the delay of the signal transmission. In FIG. 3, 122-i denotes an i-th decoder output of a number of decoder outputs, 123-i denotes an i-th driver of a number of word drivers and 124-i denotes an i-th word signal. Assuming that 123-i of the word drivers 12 is formed by a CMOS (complementary MOS) field effect transistor (FET), it needs sufficiently large P and N-channel MOS FET's as shown in FIG. 3 in order to drive a heavy load. When the MOS FET's having large current capacities are used in the coupling circuits, the signals are delayed in the coupling circuits because of the increase of the output load, and it is difficult to attain a remarkable signal transmission speed effect.

Secondly, the delays of the signal transmission among the respective logic blocks increase. As in the case of the delay of the signal transmission in each logic block, when the number of logic blocks in the system in a chip level increases, a load including the internal bus 117 for interconnecting the logic blocks also increases and the signal transmission delay is remarkable when the signal is transmitted from one logic block to another or a plurality of logic blocks.

The increase of the signal transmission delay due to a number of MOS FET's an the respective logic blocks and the increase of the signal transmission delay among the logic blocks significantly affect processing speed of a high integration logic circuit device such as a one-chip microcomputer. Since the LSI like the microcomputer performs more complex operations than a single function circuit device such as a memory LSI, the functions of the logic blocks in the chip are different from each other and flow paths of processing or processing times in the respective logic blocks differ depending on a particular condition a limit of the processing speed of the overall system of the microcomputer is determined by an integration of the limits of the processing times of the respective logic blocks of the computer or an integration of the critical paths. Accordingly, if the critical path in the logic block is shortened, the limit of the processing speed of the microcomputer is reduced. Thus, if the signal transmission delay due to the MOS FET's in the logic circuit forming the critical path of the logic block is reduced, the limit of the processing speed of the microcomputer can be reduced. For this purpose, therefore, it is not necessary to consider the signal transmission delays by the MOS FET's which do not form the critical paths.

The increase of the signal transmission delay in the respective logic blocks and the increase of the signal transmission delay among the logic blocks are due to a lack of a current driving capability of the MOS FET's used. In order to enhance the current driving capability, it has been proposed to use bipolar transistors instead of the MOS FET's. (See Japanese Laid-Open Patent Applications 55-129994 and 56-58193.) However, those references relate to a single function semiconductor memory LSI and they do not discuss problems regarding the signal delay among the logic blocks or the signal delay in the respective logic blocks in the high integration semiconductor circuit device comprising a plurality of logic blocks to which the present invention is applied. In the semiconductor memory LSI disclosed in those references, the processing time required to produce a corresponding data is constant whichever address may be selected, and the references do not discuss about the effect on the critical path by the signal delay due to the MOS FET's.

It is an object of the present invention to provide a semiconductor integrated circuit device which allows a high integration without impeding a high speed signal transmission.

The above object is attained, in accordance with the present invention, by inserting a coupling circuit having at least a portion thereof formed by a bipolar transistor capable of flowing a large current to drive large loads among logic units formed by MOS FET's and among logic blocks formed by the logic units.

Those and other objects and advantages of the present invention will be apparent from the following description of the invention discussed in connection with the accompanying drawings, in which.

Figure 2:
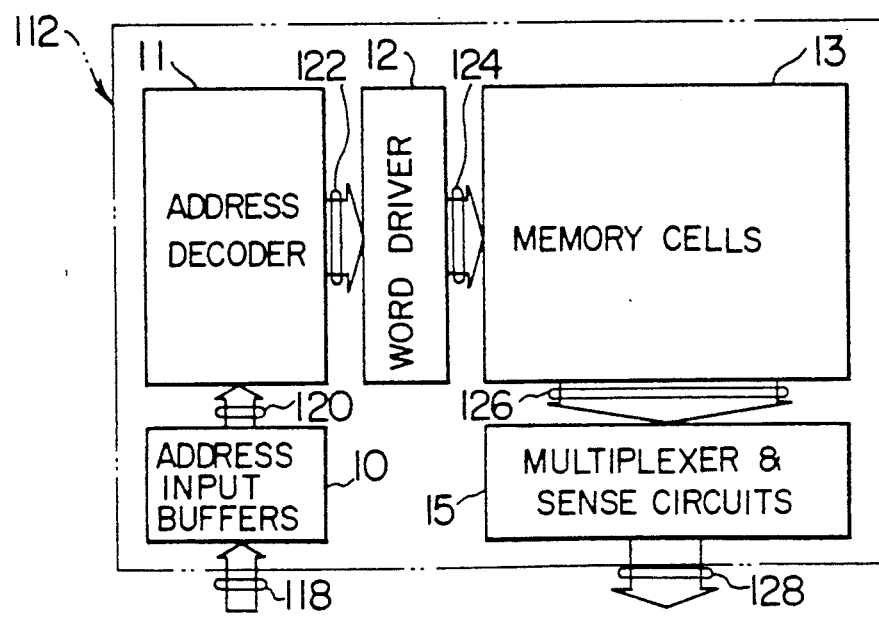
FIG. 2 shows a configuration of a ROM used in FIG. 1.
Figure 3:
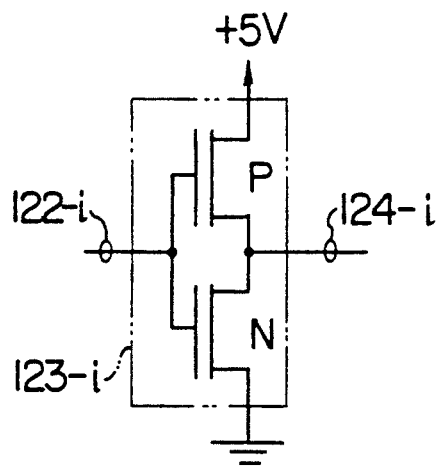
Figure 4:
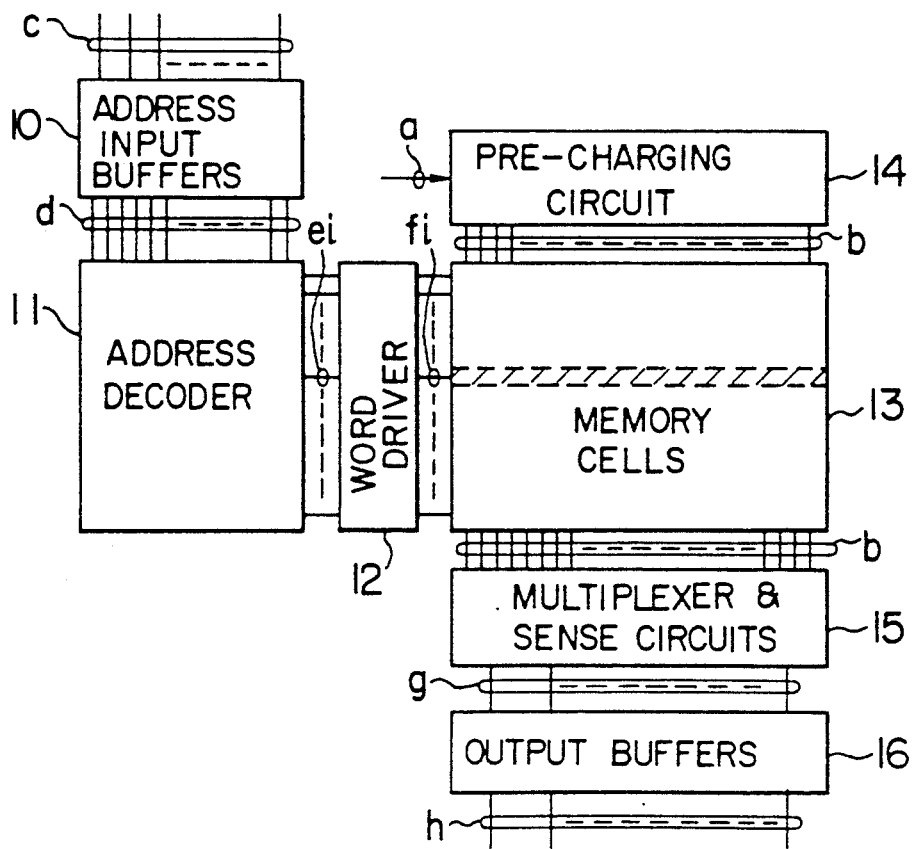
Figure 5:
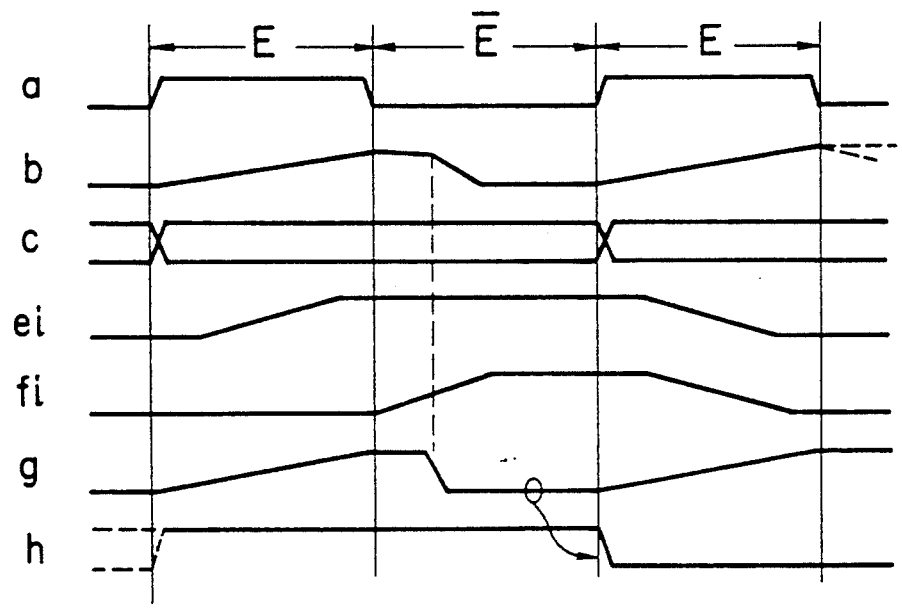
Figure 6:
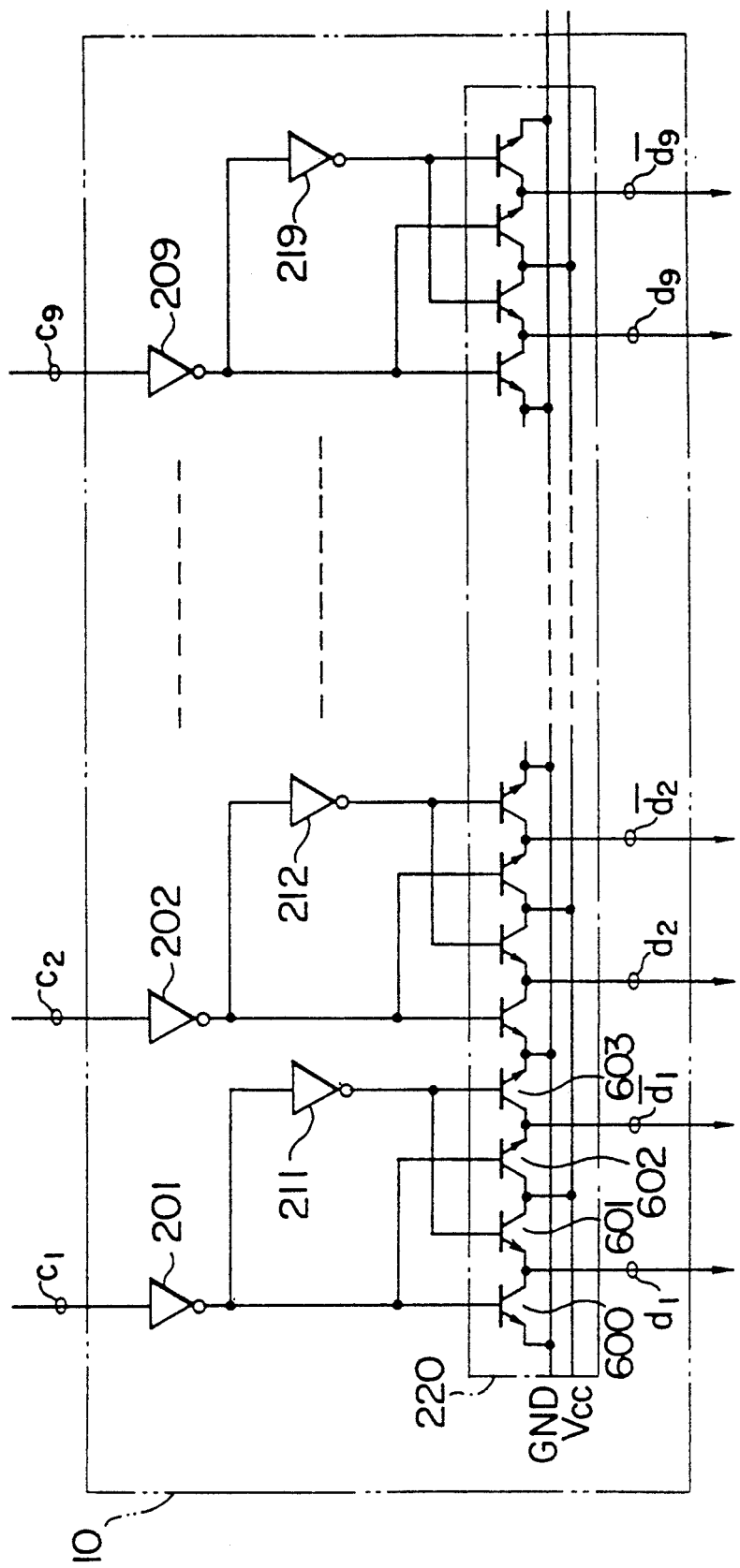
Figure 7:
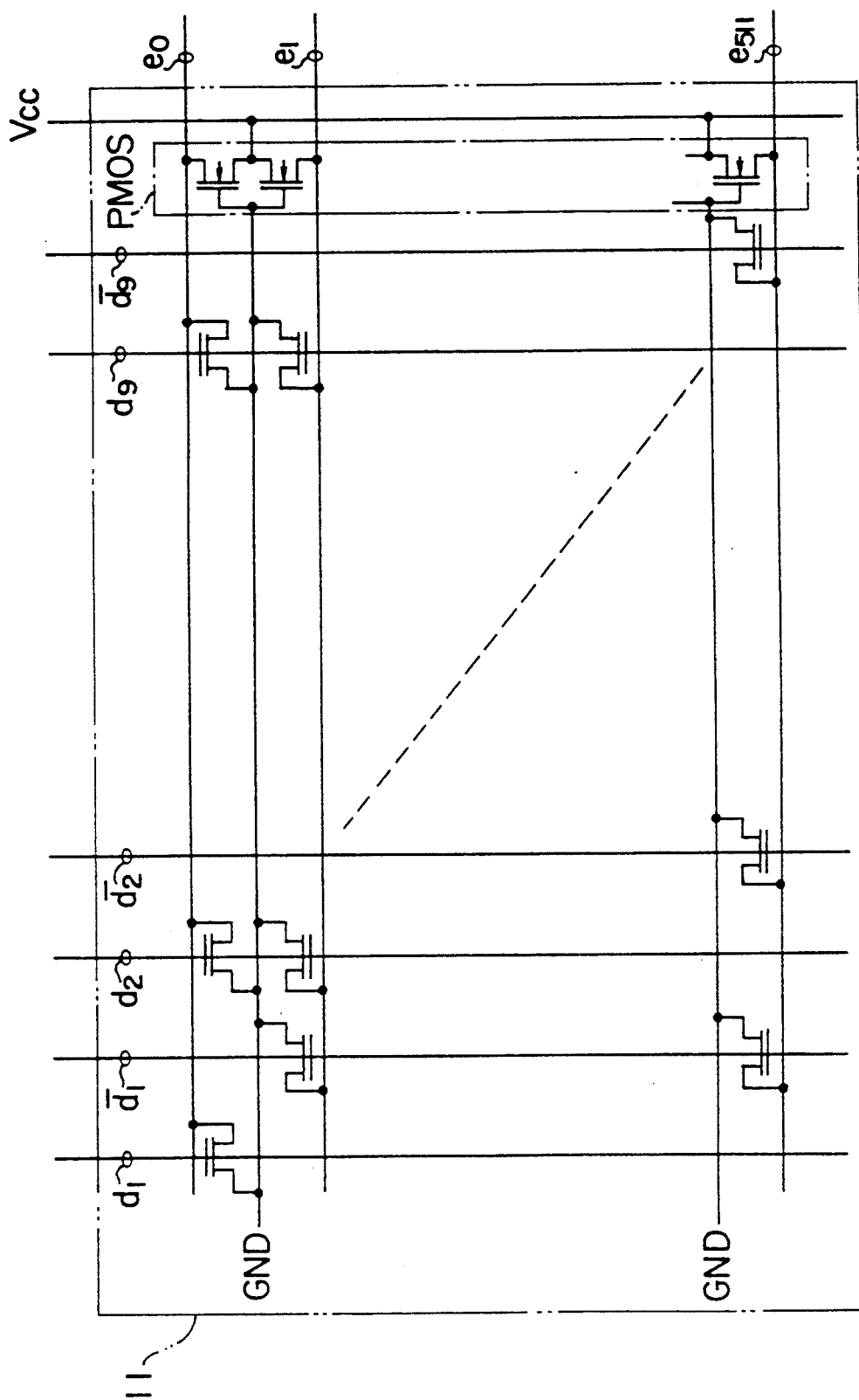
Figure 8:
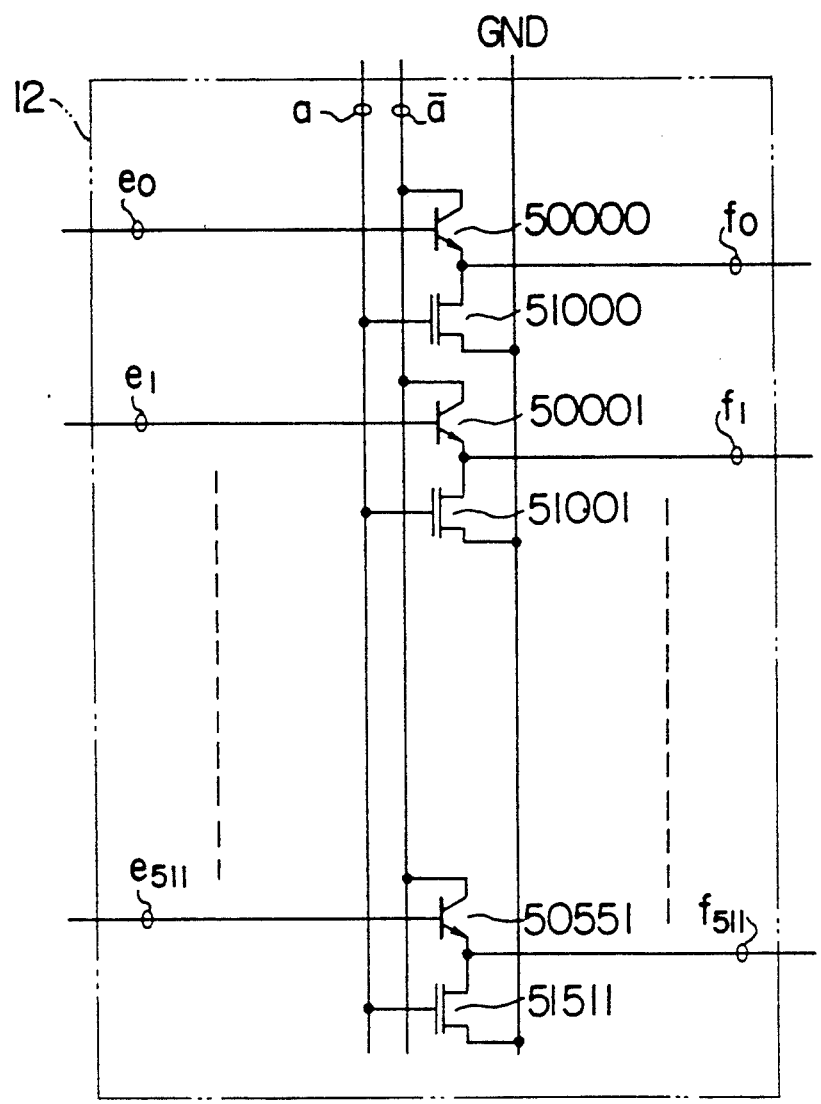
Figure 9:
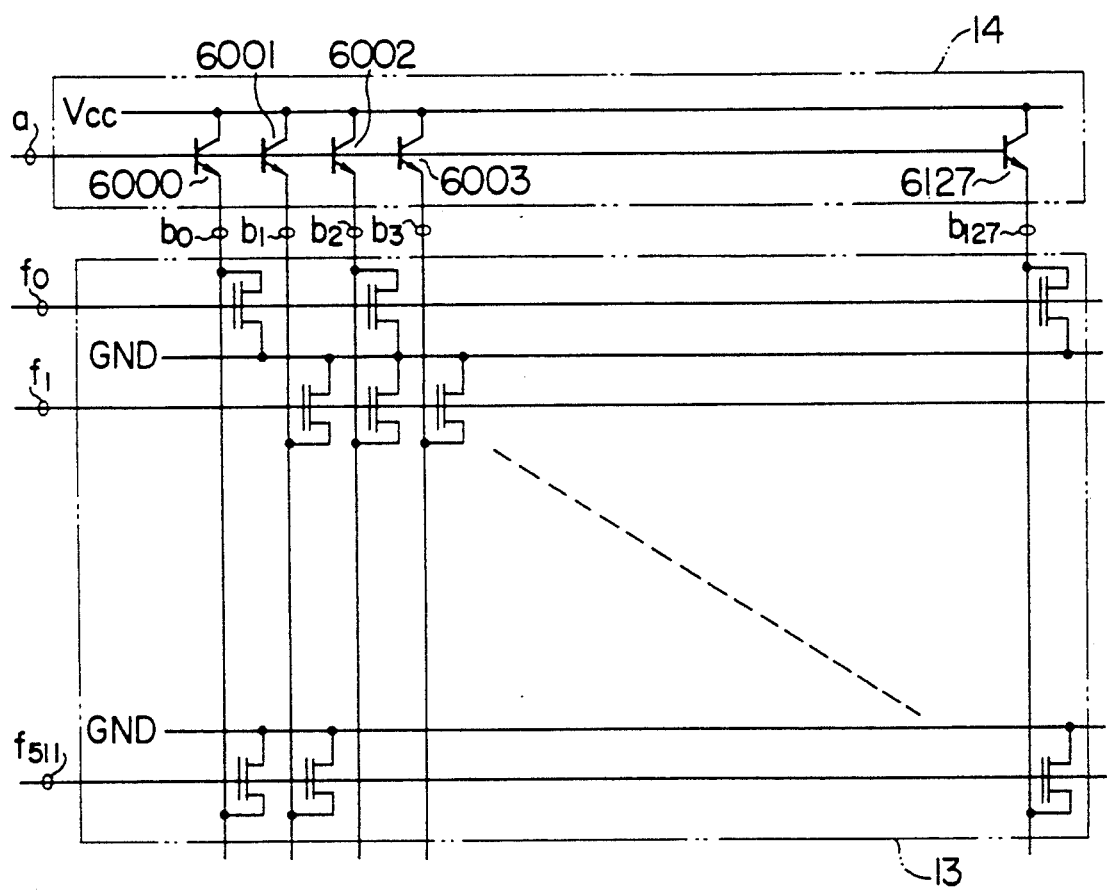
Figure 10:
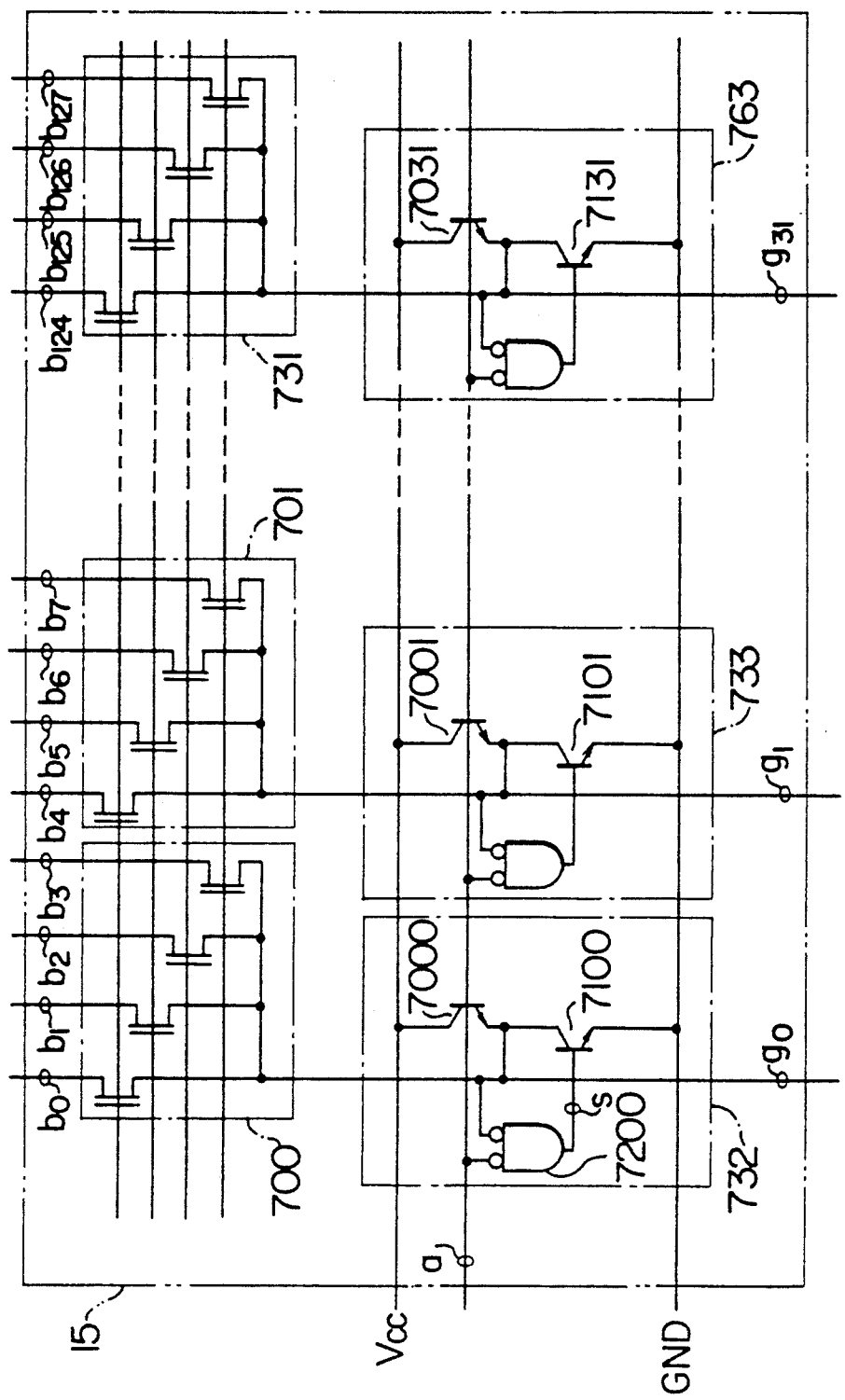
Figure 11A:
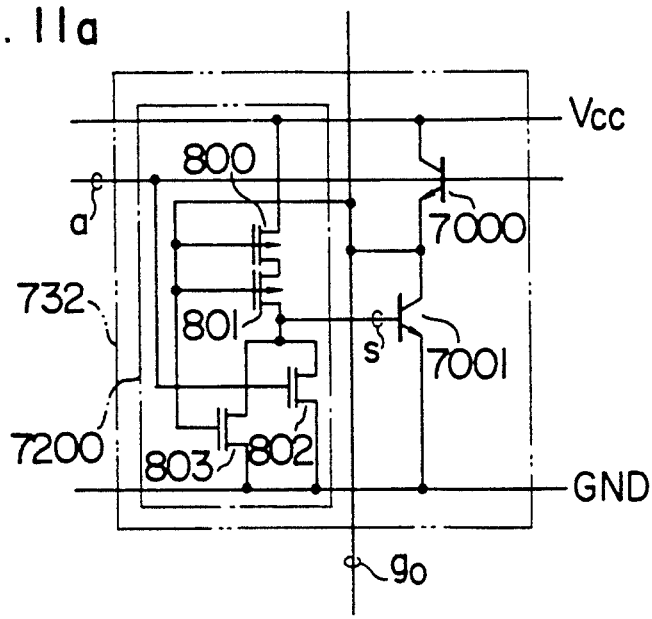
Figure 11B:
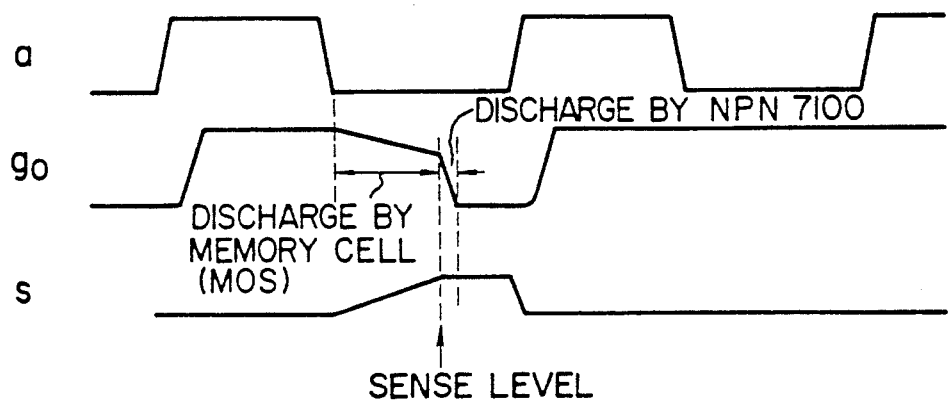
Figure 12:
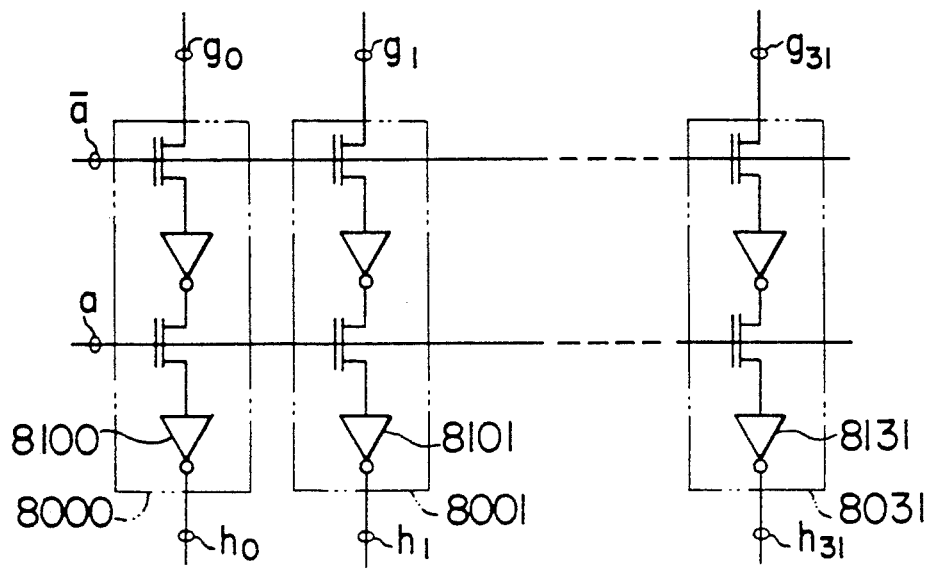
Figure 13:
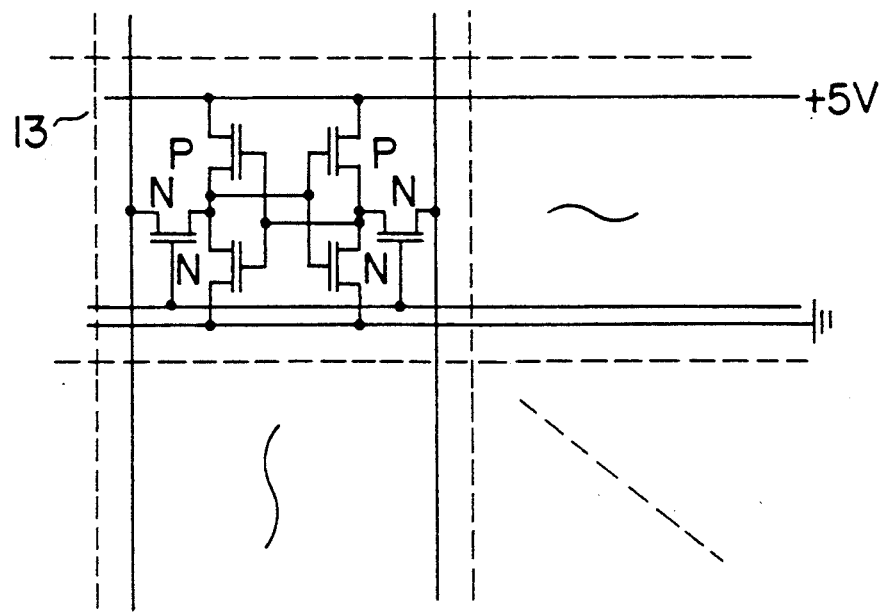
Figure 14:
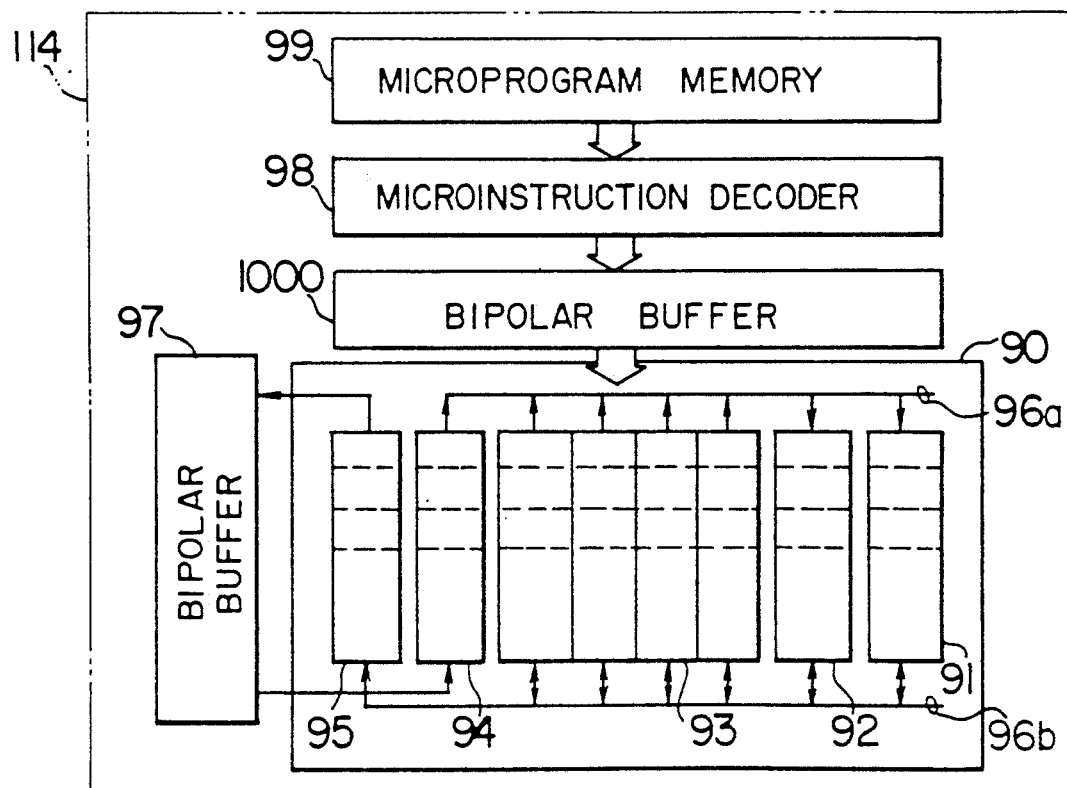
Figure 15:
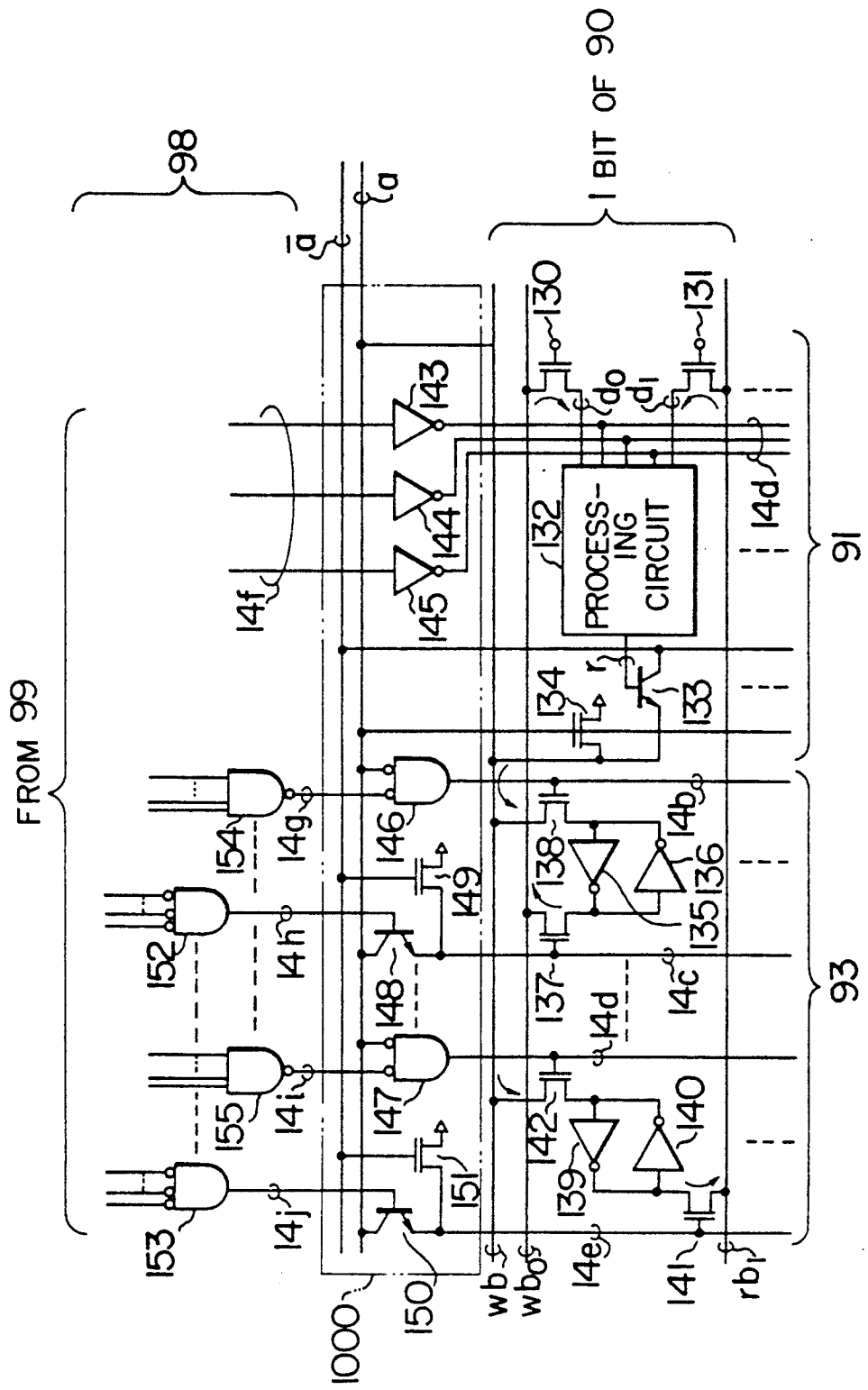
Figure 16:
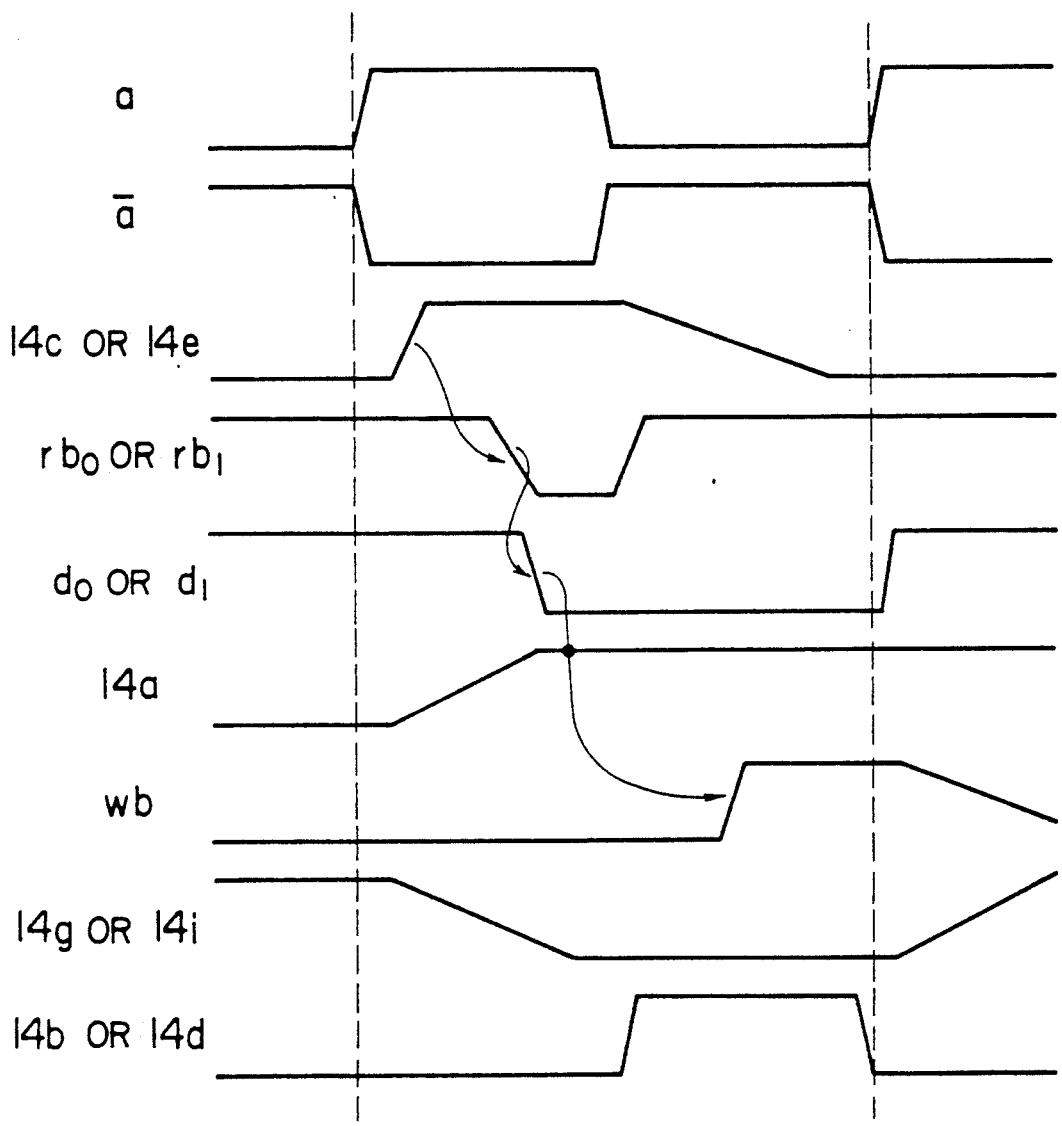
Figure 17:
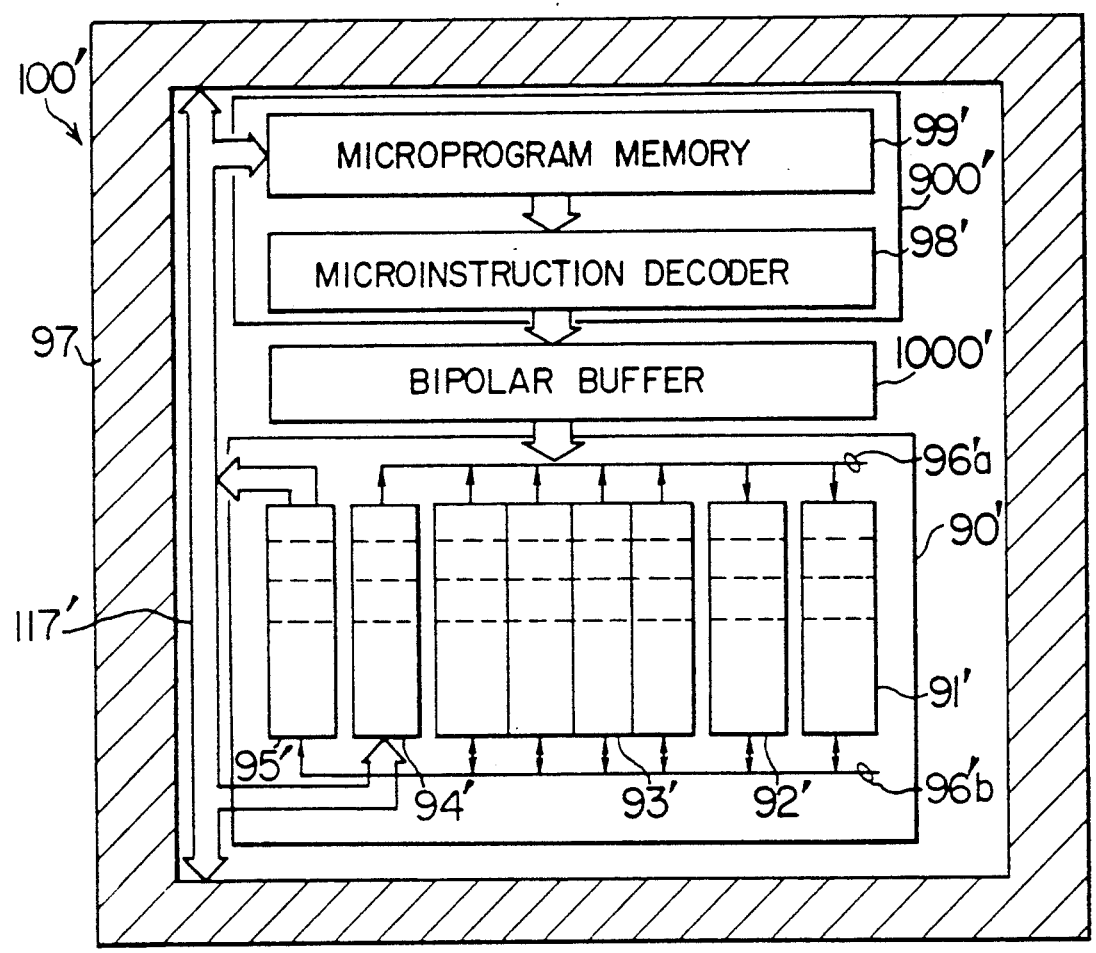

FIG. 3 is a circuit diagram of a portion of a word drive buffer 12 shown in FIG. 2, FIG. 4 shows an overall configuration of a ROM of the microcomputer in one embodiment of the present invention, FIG. 5 shows signal waveforms of the circuit of FIG. 4, FIG. 6 shows a configuration of address input buffers, FIG. 7 shows a configuration of an address decoder, FIG. 8 shows a configuration of word drivers, FIG. 9 shows a circuit diagram of memory cells and a precharging circuit, FIG. 10 shows a configuration of multiplexer and sense circuits, FIG. 11a shows a configuration of the sense circuits of FIG. 10, FIG. 11b shows waveforms of the circuits of FIG. 11a, FIG. 12 shows a configuration of output buffers with latches, FIG. 13 shows a circuit diagram of a RAM of the microcomputer in the embodiment of the present invention, FIG. 14 shows a configuration of a processor of the microcomputer in the embodiment of the present invention, FIG. 15 shows a circuit diagram of a main portion of FIG. 14, FIG. 16 shows waveforms in the circuit of FIG. 15, and FIG. 17 shows a configuration of a high integration processor device in another embodiment of the present invention.

Figure 1:
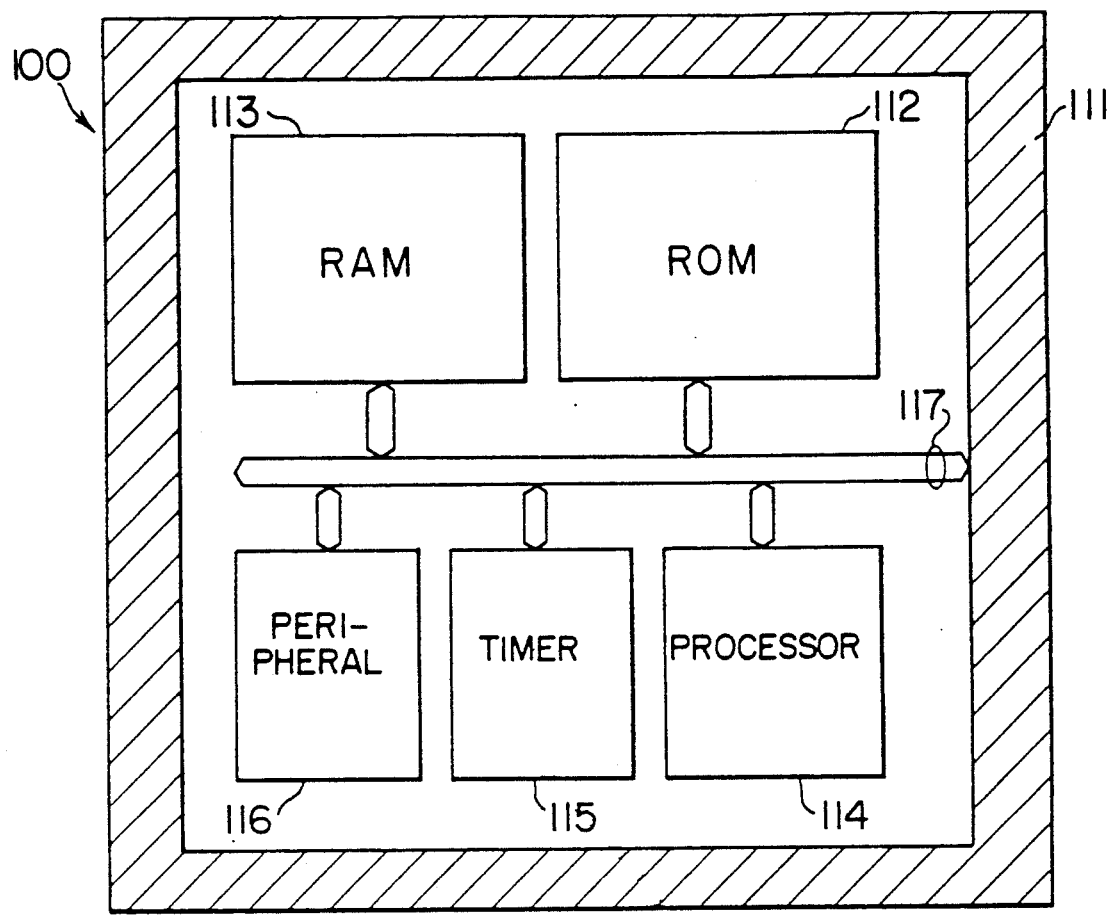
FIG. 1 shows a configuration of a typical microcomputer constructed by an LSI.

One embodiment of the present invention is now explained with reference to the drawings in which the like elements to those of FIGS. 1 and 2 are designated by the like numerals.

FIG. 4 shows an overall configuration of a ROM in one embodiment of the present invention, and FIG. 5 shows waveforms thereof. The present embodiment shows a dynamic ROM which is one of logic blocks and it comprises address input buffers 10, an address decoder 11, word drivers 12, memory cells 13, a bit line pre-charging circuit 14, bit line multiplexer and sense circuits 15 and output buffers 16. The operation is now explained for a first half period (E) and a second half period ($\overline{E}$) of a reference clock $a$.

Period E

During this period, the bit lines $b$ are pre-charged and an address is decoded. The bit lines $b$ are charged by the reference clock a applied to the pre-charging circuit 14 so that they are rendered to high levels. On the other hand, an address signal $c$ applied to the address input buffers 10 is converted to a pair of positive and negative signals $d$ by the buffers 10, which are supplied to the address decoder 11. As a result of decoding, a word signal $e_i$ assumes a high level to select a memory word. Those operations occur during the period E.

Period $\overline{E}$

A word in the memory cells 13 is selected by a word drive signal fi established during the period E and the bit lines $b$ pre-charged during the period E are selectively discharged in accordance with the states of the memory cells which constitute the selected word. As a result, a data is reflected to the bit lines $b$, and a signal g is produced by the multiplexer and sense circuits 15. A memory data $h$ is read out from the output buffers 16.

In the ROM of FIG. 1, the precharge and the discharge are repeated so that the data read cycles are repeated.

Details of the logic units of the ROM of FIG. 4 are now explained with reference to FIGS. 6, 7, 8, 9, 10, 11, 12a and 12b.

Address Input Buffers 10

FIG. 6 shows a detail of the address input buffers 10 shown in FIG. 4. Assuming that a 64K-bit ROM is used and a bit length of one word selected by the address decoder 11 is 128-bit length, the address signal c applied to the address input buffers 10 is of 9-bit length ($2^9=512$) to select one of 512 words. The 9-bit address signal c is converted to the pair of positive and negative signals $d$ (18 lines) by the buffers 201–209 and 211–219 and they are supplied to the address decoder 11. The address decoder 11 decodes one of the 512 words. Thus, the 18-line signal $d$ drives one of 256 MOS FET's. In order to enhance a driving power, NPN bipolar transistors 220 are arranged in a final stage.

· The output of the buffer 201 constituted by MOS FET's is supplied to the other buffer 211 and to the bases of the NPN bipolar transistors 600 and 602. The output of the buffer 211 is supplied to the bases of the NPN transistors 601 and 603. Accordingly, when the address signal c1 is "0", the output of the buffer 201 is and the output of the buffer 211 is "0", and the NPN bipolar transistors 600 and 602 are ON while the NPN bipolar transistors 601 and 603 are OFF. In the bipolar transistor circuit 220, the collectors of the NPN bipolar transistors 601 and 602 are connected to Vcc (power supply), the emitters of the transistors 600 and 603 are connected to GND (ground), the collector of the transistor 600 and the emitter of the transistor 601 are interconnected, the collector of the transistor 603 and the emitter of the transistor 602 are interconnected and signal lines $d_1$ and $\overline{d_1}$ are taken out from the junctions. The signal line $\overline{d_1}$ is rapidly discharged by the NPN transistor 600 and the signal line $d_1$ is rapidly charged by the NPN transistor 602. As a result, the signal line $d_1$ assumes "0" and the signal line $\overline{d_1}$ assumes "1" so that a pair of signals are produced.

In this manner, one of the transistors in each of the NPN transistor pairs 600 and 601, and 602 and 603 is ON (and the other is OFF) so that they operate like CMOS circuits. Accordingly, the current flows only when the address signal c1 changes and hence a low power consumption is attained.

Since the address decoder 11 is driven by the NPN transistors 220, the buffers 201 and 211 need only drive the NPN transistors 600, 601, 602 and 603. Accordingly, the buffers 201 and 211 may be constructed by relatively small MOS FET's. When the buffers 201 and 211 are of CMOS structure, it is more effective to save the power consumption. Since the collectors of the NPN transistors 601 and 602 may be common, a space of the bipolor transistor circuits can be reduced. The same is true for bipolar transistor circuits of the other buffers.

Address Decoder 11

FIG. 7 shows a detail of the address decoder 11 shown in FIG. 4. The address decoder 11 is arranged in an array and it is preferably constructed by MOS FET's to reduce a space. In the present embodiment, an OR array is used. For example, when the 9-bit address signal c is all "0", a signal $d_{1-9}$ is LOW and a signal $\overline{d}_{1-9}$ is HIGH. As a result, only a word signal $e_0$ is HIGH so that a word 0 is selected.

A multi-emitter NPN transistor or a combination of bipolar transistors and MOS FET's may be used in the address decoder 11.

Word Drivers 12

FIG. 8 shows a detail of the word drivers 12 shown in FIG. 4. Since the word drivers have large loads as the address input buffers do, NPN transistors are used to enhance current drive capabilities. The NPN transistors 50000–50511 serve to charge corresponding word drive signal lines $f_0$–$f_{511}$ to high level, and MOS FET's 51000–51511 serve to discharge the word drive line $f_i$ charged in the previous cycle. The word drive line $f_i$ is forcedly discharged in the pre-charge period (period E) for the bit lines. A power line $\overline{a}$ to the NPN transistors 50000–50511 is synchronized with the period $\overline{E}$ and the word drive line $f_i$ is not charged in the period E.

The above operation is carried out in the period E as shown in FIG. 5.

The word drive lines $f_0$–$f_{511}$ are discharged by the MOS FET's 51000–51511 so that they are discharged during the operation period of the address decoder 11 in the period E (a period from the settlement of the signal d to the settlement of the word signals $e_0$–$e_{511}$). Thus, the NPN transistors may be of small size. This circuit portion does not affect to the critical path. When the above operation time is very short, the bipolur transistor configuration is effective. On the other hand, the word drive lines $f_0$–$f_{511}$ are charged by the NPN transistors 50000–50511. Thus, the operation times of the word drive, the discharge of the bit lines by the memory cells and the operation of the sense circuit, which occur in the period $\overline{E}$ are shortened, and hence the period $\overline{E}$ is shortened so that a fast access is attained. By utilizing the NPN transistors in the paths which are critical to the fast access and utilizing the MOS FET's in the non-critical paths, a high speed operation is attained with small circuits.

Since the MOS FET's of the address decoder 11 need only drive one of the NPN transistors 50000–50511, they may be of small size.

Since the word signals $e_0$–$e_{511}$ which are the outputs of the OR-array address decoder 11 are high when they are active, the word driver of the present invention does not need polurity inversion and hence it may be constructed by one NPN transistor and one MOS FET as opposed to the prior art MOS FET word driver which needs two inverter stages (four MOS FET's). As a result, a high speed driver is attained with a smaller area. The number of bipolar transistors used can be reduced to a minimum and the heat generation by the bipolur transistors can be suppressed.

Memory Cells 13 and Pre-Charging Circuit 14

FIG. 9 shows a detail of the memory cells 13 and the pre-charging circuit 14. Like the address decoder 11, the memory cells 13 is arranged in an array and constructed by MOS FET's. As shown in FIG. 9, it is an OR array which is combined with the pre-charging circuit 14 to form a dynamic array by which the discharge of bit lines $b_0$–$b_{127}$ by the memory cells are inhibited during the pre-charging period (period E). The capacitive loads of the bit lines $b_0$–$b_{127}$ are large because up to 512 MOS FET's are added thereto. Thus, the pre-charging circuit 14 uses NPN transistors 6000–6127 to increase charging speeds to the bit lines $b_0$–$b_{127}$.

The memory cells 13 may be constructed by combinations of bipolar transistors and MOS FET's and the NPN transistors used in the pre-charging circuit 14 may be a multi-emitter transistor.

Multiplexer and Sense Circuit 15

FIG. 10 shows a detail of the multiplexer and sense circuits 15. As described above, each word selected by the address decoder 11 consists of 128 bits. If one memory word consists of 32 bits, four memory words are contained in a word selected by the address decoder 11. Multiplexers 700–731 shown in FIG. 10 each selects one bit from each of the bit line sets $b_0$–$b_3$, $b_4$–$b_7$, . . . , $b_{124}$–$b_{127}$ to read the required word.

Sense circuits 732–763 each corresponds to one of the multiplexers 700–731. NPN transistors 7000–7031 serve to pre-charge the outputs of the multiplexers 700–731 and NPN transistors 7100–7131 serve to discharge the outputs. The NPN transistors 7000–7031 are active during the period E and the NPN transistors 7100–7131 are active during the period $\overline{E}$. They serve to accelerate the discharge by the memory cells of the bit lines electrically connected through the multiplexers 700–731. More specifically, in the sense circuit 732, a signal line $g_0$ is pre-charged in the period E by the NPN transistor 7000. During the period $\overline{E}$, one of the bit lines $b_0$–$b_3$ is connected to the signal line $g_0$ by the MOS FET. Assuming that the bit line $b_0$ is connected, one of the memory cells connected to the bit line $b_0$ starts to discharge the bit line $b_0$ and the signal line $g_0$ also starts to discharge. In the period $\overline{E}$, the signal line (clock) $\overline{a}$ is "0", and a NOR gate 7200 constructed by MOS FET's, which receives the clock $\overline{a}$ and the signal line $g_0$ by the memory cell to raise an output signal s to "1". The signal line s is connected to a base of an NPN transistor 7100, which flows a base current in response to a small voltage rise to turn it on. As a result, the signal line $g_0$ is discharged to "0" at a high speed.

The above operation is applicable to other sense circuits 733–763. By constructing the pre-charging NPN transistors 7000-7031 by a multi-emitter transistor, the space of the circuits can be reduced.

Referring to the FIGS. 11a and 11b, a detail of the voltage drop detection of the signal line $g_0$ by the NOR gate 7200 is explained. FIG. 11a shows a detail of the sense circuit 732 and FIG. 11b shows waveforms thereof.

(1) Period E

During the period E, the clock a is "1". Thus, the signal line $g_0$ is charged by the NPN transistor 7000. On the other hand, the base input signal s to the NPN transistor 7100 is "0" by the NMOS transistor 802 of the NOR gate 7200. Accordingly, the signal line $g_0$ is not discharged by the NPN transistor 7100.

(2) Period $\bar{E}$

During the period $\bar{E}$, the clock a is "0" and the signal line $g_0$ is initially "1". The PMOS transistor 800 and the NMOS transistor 803 of the NOR gate 7200 are ON, and the PMOS transistor 801 and the NMOS transistor 802 are OFF. Under this condition, the NOR gate 7200 functions as an inverter by the PMOS transistor 801 and the NMOS transistor 803. When the signal line $g_0$ starts to discharge by the memory cell, a resulting voltage drop in the signal line $g_0$ is amplified by a gain of the inverter to produce the output signal s. Accordingly, the NPN transistor 7100 can be turned on by a small voltage drop in the signal ling $g_0$. FIG. 11b shows waveforms of the above operation. When the signal line $g_0$ reaches a certain voltage level (sense level) during the discharge by the memory cell (MOS), it is thereafter discharged at a high speed by the NPN transistor 7100.

Output Buffers 16

FIG. 12 shows a detail of the output buffers 16 with latches. Latches 8000-8031 are master/slave dynamic MOS latches which store data in the periods $\bar{E}$ and E. When loads are small, inverters 8100-8131 at a final stage connected to the internal bus (117 in FIG. 1) may be MOS inverters. When the capacitive loads of the logic blocks including the internal bus are large, it is effective to construct the inverters by bipolar transistors.

In accordance with the present embodiment, the advantages of the compuctness and the low power consumption of the MOS FET's and the high current drive capability of the bipolar transistors are effectively utilized. Accordingly, a high speed and high integration ROM can be attained in a microcomputer LSI.

In the above embodiment, each of the logic units of the ROM 112 is constructed by a matrix of a number of units each consisting of one MOS FET. On the other hand, as shown in FIG. 13, the memory cells of the RAM 113 which is one of the logic blocks of the microcomputer is constructed by a matrix of a plurality of units each consisting of a plurality of MOS FET's. In such a memory, the capacitive load also increases by the high integration. Accordingly, the increase of the signal transmission delay can be prevented by driving the load by bipolar buffers constructed by bipolar transistors.

FIG. 14 shows a configuration of a processing circuit of the processor 114 in one embodiment of the present invention. It is constructed in a different manner from the ROM 112 descrived above. The processing circuit 90 is constructed by a matrix of different logic units such as ALU 91, shifter 92, operation registers 93, input register 94 and output register 95, which are connected to buses 96a and 96b. The output register 95 is connected to the internal bus (117 in FIG. 1) of the microcomputer by a bipolar buffer 97 to enhance the drive capability to the internal bus as is done in the output buffers 16 of the ROM 112.

In the processing circuit 90, an output of a microprogram memory 99 of the same construction as the ROM 112, in the processor of the microprogram-controlled microcomputer is decoded by a microinstruction decoder 98, and the output thereof is amplified by a bipolar buffer 1000. The microinstruction from the microprogram memory 99 is decoded by the microinstruction decoder 98 to control the processing circuit 90. While not shown, the microinstruction decoder 98 comprises a random arrangement and/or at least one PLA (Programmable logic array) of logic units. The outputs of the randomly arranged logic units are also amplified by the bipolar buffer 1000 so that the heavy load processing circuit 90 is controlled at a high speed.

FIG. 15 shows a detail of a portion of FIG. 14 and FIG. 16 shows waveforms thereof. The microinstruction read from the microprogram memory 99 is decoded by the microinstruction decoder 98 into signals to control the processing circuit 90. As an example, a register-to-register operation is explained below.

(1) Readout of Register

The microinstruction selects registers which are to sent out the data to buses $rb_0$ and $rb_1$, by the decoders (e.g. 152 and 153) constructed by MOS FET's. Assuming that the two registers shown are selected from the registers 93, the outputs 14h and 14j of the decoders 152 and 153 assume "1", respectively, and the signal lines 14c and 14e are driven at a high speed by the NPN transistors 148 and 150 in the period E (clock a is "1"). The data read MOS gates 137 and 141 of the respective registers are driven by the signal lines 14c and 14e and the data of the respective registers are sent out to the buses $rb_0$ and $rb_1$, respectively. Since the readout of the register to the bus is required at the beginning of one micro-operation, a highest speed is required. The MOS FET's 149 and 151 are used to keep the signal lines 14c and 14e to "0" during the period $\bar{E}$ (clock a is "1") to inhibit the readout of the registers. The drivers for reading the registers can be implemented by the same circuit as the word drivers shown in FIG. 8.

By pre-charging the buses $rb_0$ and $rb_1$ in the period $\bar{E}$ and adding the sense circuits 732 shown in FIGS. 10, 11a and 11b to discharge the buses, the speed of the readout of the registers can be increased.

(2) Latching of Data on Buses

The data sent out to the buses $rb_0$ and $rb_1$ are latched during the period E by the MOS FET's 130 and 131 arranged at the input of the ALU 91.

(3) Arithmetic Operation

The latched data $d_0$ and $d_1$ are processed by the processing circuit 132 of the ALU 91 under the control of the signal 14a derived by driving the MOS inverters 143-145 by the operation code signal 14f. The result is sent out to the bus Wb by the driver constructed by the NPN transistor 133 and the MOS FET 134. This driver maintains the bus Wb at "0" during the period E, and if the result r is "0", it keeps the bus Wb unchanged during the period $\bar{E}$, and if the result r is "1", it charges the bus Wb to "1" by the NPN transistor 133.

(4) Writing to Registers

The data on the bus Wb is written into one of the registers 93 which has "0" output at the corresponding write decoder. For example, if the outputs 14g and 14i of the decoders 154 and 155 are "0", the write pulses synchronized with the clock a are produced on the signal lines 14b and 14d by the $\overline{\text{MOS}}$ gates 146 and 147 in the period $\overline{\text{E}}$, and the data on the bus Wb is written into the register through the MOS gates 138 and 142.

In the one micro-operation described above, the register readout to be executed first is the worst critical path. Thus, the readout signals 14c and 14e must be driven at a high speed by the NPN transistors 148 and 150. The bipolar driver 1000 is thus characterized by the use of the NPN transistors in the critical path area.

FIG. 16 shows waveforms of the signals described above.

Bipolar transistors may be arranged at the outputs of the ALU 91, shifter 92, operation registers 93, input register 94 and output register 95 of the processing circuit 90 to enhance the drive capability of the outputs depending on a degree of integration of the driven units so that the increase of the signal transmission delay can be prevented.

In accordance with the present embodiment, the bipolar buffer constructed by the bipolar transistors is inserted between the high integration logic blocks such as processor and ROM in the microcomputer or between high integration logic units of the logic block such as the MOS address decoder of the ROM and the MOS memory to current-amplify the output of the preceding stage so that the logic unit or the logic block in the succeeding stage is positively driven. As a result, even if the capacitive load increases by the high integration of the MOS FET's, the signal transmission delay between the logic units or the logic blocks is prevented and the high integration of the semiconductor circuit is attained while maintaining the high speed. The bipolar buffer can be formed on a silicon chip of several millimeters square together with the ligic units or the logic blocks. Since the bipolar transistors are distibutedly arranged, local heat generation by the bipolar transistors is prevented.

When the function of the processor is complex, a number of MOS FET's must be integrated to form the processor on a silicon chip. In such a high integration processor, the decrease of the signal transmission speed due to the increase of the capacitive load is again a problem.

FIG. 17 shows a configration of a high integration processor in another embodiment of the present invention. As seen from FIG. 17, the processor has almost the same configuration as that of the processor which is one of the logic blocks shown in FIG. 14 but the processor is constructed by an LSI to attain high integration.

In FIG. 17, the primed numerals denote the elements of the corresponding numerals shown in FIG. 14 except for an internal bus 117' and a microinstruction control block 900'. Only the scale of integration differs. A processing circuit 90' and the microinstruction control block 900' in FIG. 17 may correspond to the logic blocks, and an ALU 91', a shifter 92', operation registers 93', an input register 94', an output register 95', a microinstruction decoder 98' and a microprogram memory 99' may correspond to the logic units, and buses 96'a, 96'b and the internal bus 117', and a buffer 1000' including bipolar transistors correspond to the coupling circuits. The operation is similar to that of FIG. 14 and a detailed explanation thereof is omitted here.

As described herein above, according to the semiconductor integrated circuit device of the present invention, the coupling circuit having at least a portion thereof constructed by the bipolar transistors is inserted between the logic blocks of the integrated circuit device or between the logic units of the logic block. Accordingly, the high integration of the semiconductor integrated circuit device is attained while maintaining the high speed.

We claim:

1. A data processor integrated on a semiconductor substrate comprising:

first and second internal buses;

a microprogram memory means for storing a microinstruction, wherein said microprogram memory means comprises a plurality of MOSFETs;

a microinstruction decoding means for decoding the microinstruction of said microprogram memory means into a control signal, wherein said microinstruction decoding means comprises a plurality of MOSFETs; and a processing circuit responsive to the control signal and including:

an arithmetic logic unit comprising a plurality of MOSFETs, said arithmetic logic unit being connected to said second internal bus, a plurality of operation registers, each comprising a plurality of MOSFETs, said operation registers being connected to said second internal bus, an input register comprising a plurality of MOSFETs, said input register being connected to said second internal bus, and an output register comprising a plurality of MOSFETs, said output register being connected to said second internal bus and connected to said first internal bus to provide a path for the transfer of data, wherein the connection between the output register and the first internal bus includes a buffer comprised of at least one bipolar transistor arranged to provide a direct connection between the plurality of MOSFETs of the output register and other MOSFET circuits having inputs connected to said first internal bus.

2. A data processor integrated on a semiconductor substrate comprising:

first and second internal buses;

a microprogram memory means for storing a microinstruction, wherein said microprogram memory means comprises a plurality of MOSFETs; and a microinstruction decoding means comprising a plurality of MOSFETs, for decoding the microinstruction of said microprogram memory means into a control signal, wherein the microinstruction decoding means is connected to a processing circuit to provide a path for the microinstruction control of the processing circuit, and wherein the connection of the microinstruction decoding means and the processing circuit includes a buffer comprised of at least one bipolar transistor arranged to provide a direct connection between the plurality of MOSFETs of the microinstruction decoding means and other MOSFET circuits in said processing circuit, wherein said processing circuit responsive to the control signal includes:

an arithmetic logic unit comprising a plurality of MOSFETs, said arithmetic logic unit being connected to said second internal bus, a plurality of operation registers, each comprising a plurality of MOSFETs, said operation registers being connected to said second internal bus, an input register comprising a plurality of MOSFETs, said input register being connected to said second internal bus, and an output register comprising a plurality of MOSFETs, said output register being connected to said second internal bus and connected to said first internal bus.

3. A data processor integrated on a semiconductor substrate comprising:

first and second internal buses;

a memory means for storing data, and including a plurality of memory cells each having at least one MOSFET, wherein said memory means is connected to said first internal bus to provide a path for the transfer of data;

a microprogram memory means for storing a microinstruction, wherein said microprogram memory means comprises a plurality of MOSFETs;

a microinstruction decodng means for decoding the microinstruction of said microprogram memory means into a control signal, wherein said microinstruction decoding means comprises a plurality of MOSFETs; and a processing circuit responsive to the control signal and including:

an arithmetic logic unit comprising a plurality of MOSFETs, said arithmetic logic unit being connected to said second internal bus, a plurality of operation registers, each comprising a plurality of MOSFETs, said operation registers being connected to said second internal bus, an input register comprising a plurality of MOSFETs, said input register being connected to said second internal bus, and an output register comprising a plurality of MOSFETs, said output register being connected to said second internal bus and connected to said first internal bus, wherein the connection between the memory means and the first internal bus includes a buffer comprised of at least one bipolar transistor arranged to provide a direct connection between the MOSFETs of the memory means and other MOSFET circuits having inputs connected to said first internal bus.

4. A data processor integrated on a semiconductor substrate comprising:

first and second internal buses;

a microprogram memory means for storing a microinstruction, wherein said microprogram memory means comprises a plurality of MOSFETs;

a microinstruction decodng means comprising a plurality of MOSFETs, for decoding the microinstruction of said microprogram memory means into a control signal, and a processing circuit responsive to the control signal and including:

an arithmetic logic unit comprising a plurality of MOSFETs, said arithmetic logic unit being connected to said second internal bus to provide a path for the transfer of data, a plurality of operation registers, each comprising a plurality of MOSFETs, said operation registers being connected to said second internal bus, an input register comprising a plurality of MOSFETs, said input register being connected to said second internal bus, and an output register comprising a plurality of MOSFETs, said output register being connected to said second internal bus and connected to said first internal bus, wherein the connection between the arithmetic logic unit and said second internal bus includes a buffer comprised of at least one bipolar transistor arranged to provide a direct connection between the plurality of MOSFETs of the arithmetic logic unit and other MOSFET circuits having inputs connected to said second internal bus.

5. A data processor integrated on a semiconductor substrate comprising:

first and second internal buses;

a memory means including:

a plurality of memory cells each having at least one MOSFET, an address input buffer comprising a first stage comprising a plurality of MOSFETs responsive to an address signal for converting said address signal to a pair of positive and negative signals, and a second stage connected to an address decoder for decoding the pair of positive and negative signals to a word signal, said address decoder comprising a plurality of MOSFETs, a word line driver responsive to the word signal for charging a word drive line of said memory cells, said word line driver including a MOSFET for discharging the word drive line of said memory cells, a precharge circuit for charging a bit line of said memory cells during a precharge period, a sense circuit for sensing the bit line of said memory cells, and an output buffer to be responsive to an output signal of said sense circuit, said output buffer being connected to the first bus, a microprogram memory means for storing a microinstruction;

a microinstruction decodng means for decoding the microinstruction of said microprogram memory means into a control signal; and a processing circuit responsive to the control signal and including:

an arithmetic logic unit connected to said second internal bus, a plurality of operation registers connected to said second internal bus, an input register connected to said second internal bus, and an output register connected to said second internal bus and connected to said first internal bus, wherein the second stage of the address input buffer comprises at least one bipolar transistor, and wherein the word line driver comprises at least one bipolar transistor arranged to provide a direct connection between the MOSFETs of the word driver and MOSFETs in said memory cells.

6. A data processor integrated on a semiconductor substrate comprising:

first and second internal buses;

a memory means including:

a plurality of memory cells each having at least one MOSFET, an address input buffer responsive to an address signal for converting said address signal to a pair of positive and negative signals, an address decoder for decoding the pair of positive and negative signals to a word signal, a word driver responsive to the word signal for charging a word drive line of said memory cells, and for discharging the word drive line of said memory cells, a precharge circuit for charging a bit line of said memory cells during a precharge period, a sense circuit comprising a plurality of MOSFETs for sensing the bit line of said memory cells, an output buffer comprising a plurality of MOSFETs to be responsive to an output signal of said sense circuit, said output buffer being connected to the first internal bus, a microprogram memory means for storing a microinstruction;

a microinstruction decoding means for decoding the microinstruction of said microprogram memory means into a control signal; and a processing circuit responsive to the control signal and including:

an arithmetic logic unit connected to said second internal bus, a plurality of operation registers connected to said second internal bus, an input register connected to said second internal bus, and an output register connected to said second internal bus and connected to said first internal bus, wherein the precharge circuit and the sense circuit are each comprised of at least one bipolar transistor, and wherein the connection of the output buffer to the first internal bus is through at least one bipolar transistor arranged to provide a direct connection between the plurality of MOSFETs of the output buffer and other MOSFET circuits having inputs connected to said first internal bus.

7. A data processor integrated on a semiconductor substrate comprising:

first and second internal buses;

a memory means including:

a plurality of memory cells each having at least one MOSFET, an address input buffer comprising a first stage comprising a plurality of MOSFETs responsive to an address signal for converting said address signal to a pair of positive and negative signals, and a second stage connected to an address decoder for decoding the pair of positive and negative signals to a word signal, said address decoder comprising a plurality of MOSFETs, a word driver responsive to the word signal for charging a word drive line of said memory cells, said word driver including a MOSFET for discharging the word drive line of said memory cells, a precharge circuit for charging a bit line of said memory cells during a precharge period, a sense circuit for sensing the bit line of said memory cells, and an output buffer to be responsive to an output signal of said sense circuit, said output buffer being connected to the first bus, a microprogram memory means for storing a microinstruction;

a microinstruction decoding means for decoding the microinstruction of said microprogram memory means into a control signal; and a processing circuit responsive to the control signal and including:

an arithmetic logic unit connected to said second internal bus, a plurality of operation registers connected to said second internal bus, an input register connected to said second internal bus, and an output register connected to said second internal bus and connected to said first internal bus, wherein the second stage of the address input buffer includes at least one bipolar transistor arranged to provide a direction connection between the plurality of MOSFETs of the first stage of the address input buffer and said plurality of MOSFETs in said address decoder.

8. A data processor integrated on a semiconductor substrate comprising:

first and second internal buses;

a memory means including:

a plurality of memory cells each having at least one MOSFET, an address input buffer comprising a first stage comprising a plurality of MOSFETs responsive to an address signal for converting said address signal to a pair of positive and negative signals, and a second stage connected to an address decoder for decoding the pair of positive and negative signals to a word signal, said address decoder comprising a plurality of MOSFETs, a word line driver responsive to the word signal for charging a word drive line of said memory cells, said word line driver including a MOSFET for discharging the word drive line of said memory cells, a precharge circuit for charging a bit line of said memory cells during a precharge period, a sense circuit for sensing the bit line of said memory cells, and an output buffer to be responsive to an output signal of said sense circuit, said output buffer being connected to the first bus, a microprogram memory means for storing a microinstruction;

a microinstruction decoding means for decoding the microinstruction of said microprogram memory means into a control signal; and a processing circuit responsive to the control signal and including:

an arithmetic logic unit connected to said second internal bus, a plurality of operation registers connected to said second internal bus, an input register connected to said second internal bus, and an output register connected to said second internal bus and connected to said first internal bus, wherein the word line driver comprises at least one bipolar transistor arranged to provide a direction connection between the MOSFET of the word driver and MOSFETs in said memory cells.

9. A data processor integrated on a semiconductor substrate comprising:

first and second internal buses;
a memory means including:
    a plurality of memory cells each having at least one MOSFET,
    an address input buffer responsive to an address signal for converting said address signal to a pair of positive and negative signals,
    an address decoder for decoding the pair of positive and negative signals to a word signal,
    a word driver responsive to the word signal for charging a word drive line of said memory cells, and for discharging the word drive line of said memory cells,
    a precharge circuit for charging a bit line of said memory cells during a precharge period,
    a sense circuit comprising a plurality of MOSFETs for sensing the bit line of said memory cells, and
    an output buffer comprising a plurality of MOSFETs to be responsive to an output signal of said sense circuit, said output buffer being connected to the first internal bus,
a microprogram memory means for storing a microinstruction;
a microinstruction decoding means for decoding the microinstruction of said microprogram memory means into a control signal; and
a processing circuit responsive to the control signal and including:
    an arithmetic logic unit connected to said second internal bus,
    a plurality of operation registers connected to said second internal bus,
    an input register connected to said second internal bus, and
    an output register connected to said second internal bus and connected to said first internal bus,
wherein the precharge circuit comprises at least one bipolar transistor arranged to provide a direct connection between a MOSFET of the precharge circuit and MOSFETs of said memory cells.

10. A data processor integrated on a semiconductor substrate comprising:
first and second internal buses;
a memory means including:
    a plurality of memory cells each having at least one MOSFET,
    an address input buffer responsive to an address signal for converting said address signal to a pair of positive and negative signals,
    an address decoder for decoding the pair of positive and negative signals to a word signal,
    a word driver responsive to the word signal for charging a word drive line of said memory cells, and for discharging the word drive line of said memory cells,
    a precharge circuit for charging a bit line of said memory cells during a precharge period,
    a sense circuit comprising a plurality of MOSFETs for sensing the bit line of said memory cells, and
    an output buffer comprising a plurality of MOSFETs to be responsive to an output signal of said sense circuit, said output buffer being connected to the first internal bus,
a microprogram memory means for storing a microinstruction;
a microinstruction decoding means for decoding the microinstruction of said microprogram memory means into a control signal; and
a processing circuit responsive to the control signal and including:
    an arithmetic logic unit connected to said second internal bus,
    a plurality of operation registers connected to said second internal bus,
    an input register connected to said second internal bus, and
    an output register connected to said second internal bus and connected to said first internal bus,
wherein the sense circuit comprises at least one bipolar transistor arranged to provide a direct connection between the plurality of MOSFETs of the sense circuit and MOSFETs of said memory cells.

11. A data processor integrated on a semiconductor substrate comprising:
first and second internal buses;
a memory means including:
    a plurality of memory cells each having at least one MOSFET,
    an address input buffer responsive to an address signal for converting said address signal to a pair of positive and negative signals,
    an address decoder for decoding the pair of positive and negative signals to a word signal,
    a word driver responsive to the word signal for charging a word drive line of said memory cells, and for discharging the word drive line of said memory cells,
    a precharge circuit for charging a bit line of said memory cells during a precharge period,
    a sense circuit comprising a plurality of MOSFETs for sensing the bit line of said memory cells, and
    an output buffer comprising a plurality of MOSFETs to be responsive to an output signal of said sense circuit, said output buffer being connected to the first internal bus,
a microprogram memory means for storing a microinstruction;
a microinstruction decoding means for decoding the microinstruction of said microprogram memory means into a control signal; and
a processing circuit responsive to the control signal and including:
    an arithmetic logic unit connected to said second internal bus,
    a plurality of operation registers connected to said second internal bus,
    an input register connected to said second internal bus, and
    an output register connected to said second internal bus and connected to said first internal bus,
wherein the connection of the output buffer to the first internal bus is comprised of at least one bipolar transistor arranged to provide a direct connection between the plurality of MOSFETs of the output buffer and other MOSFET circuits having inputs connected to said first internal bus.

12. A data processor integrated on a semiconductor substrate comprising:
a bus;
an instruction decoder for decoding instructions; and
a processing circuit including a logic unit and a plurality of MOSFETs controlled by the decoded instructions, and having an output part connected to said bus to provide a path for the transfer of data,
wherein the connection of the output part of said processing circuit to said bus includes a buffer comprised of at least one bipolar transistor arranged to provide a direct connection between the plurality of MOSFETs of the processing circuit and other MOSFET circuits having inputs connected to said bus.

13. A data processor integrated on a semiconductor substrate comprising:
an instruction decoder for decoding instructions; and
a processing circuit including a logic unit and a plurality of MOSFETs connected to said instruction decoder,
wherein the connection of the processing circuit to said instruction decoder provides a path for an instruction control of said data processor, and wherein the connection of the instruction decoder and the processing circuit includes a buffer comprised of at least one bipolar transistor arranged to provide a direct connection between the plurality of MOSFETs of the processing circuit and MOSFET circuits in said instruction decoder.

14. A data processor integrated on a semiconductor substrate comprising:
a bus;
a memory having an output part connected to said bus; and
a processor including a logic circuit and a plurality of MOSFETs, and connected to said bus to provide a path for the transfer of data,
wherein the connection of the output part of the memory and the bus includes a buffer comprised of at least one bipolar transistor arranged to provide a direct connection between MOSFETs of the memory and other MOSFET circuits having inputs connected to said bus.

15. A data processor integrated on a semiconductor substrate comprising:
an instruction decoder for decoding instructions; and
a processing circuit including a logic unit and being controlled by the decoded instructions, and comprising a plurality of elements including an arithmetic logic unit, a shifter, an operation register, an input register and an output register, each connected to an internal bus to provide a path for the transfer of data and each comprised of a plurality of MOSFETs,
wherein the connection of the processing at least one of said elements to said internal bus includes a buffer comprised of at least one bipolar transistor arranged to provide a direct connection between MOSFETs of said at least one of said elements and other MOSFET circuits having inputs connected to said internal bus.

16. A data processor comprising:
a bus;
an instruction decoder for decoding instructions; and
a processing circuit including a logic unit and a plurality of MOSFETs controlled by the decoded instructions, and having an output part connected to said bus to provide a path for the transfer of data,
wherein the connection of the output part of said processing circuit to said bus includes a buffer comprised of at least one bipolar transistor arranged to provide a direct connection between the plurality of MOSFETs of the processing circuit and other MOSFET circuits having inputs connected t said bus.

17. A data processor comprising:
an instruction decoder for decoding instructions; and
a processing circuit including a logic unit and a plurality of MOSFETs connected to said instruction decoder,
wherein the connection of the processing circuit to said instruction decoder provides a path for an instruction control of said data processor, and wherein the connection of the instruction decoder and the processing circuit includes a buffer comprised of at least one bipolar transistor arranged to provide a direct connection between the plurality of MOSFETs of the processing circuit and MOSFET circuits in said instruction decoder.

18. A data processor comprising:
a bus;
a memory having an output part connected to said bus; and
a processor including a logic circuit and a plurality of MOSFETs, and connected to said bus to provide a path for the transfer of data,
wherein the connection of the output part of the memory and the bus includes a buffer comprised of at least one bipolar transistor arranged to provide a direct connection between MOSFETs of the memory and other MOSFET circuits having inputs connected to said bus.

19. A data processor comprising:
an instruction decoder for decoding instructions; and
a processing circuit including a logic unit and being controlled by the decoded instructions, and comprising a plurality of elements including an arithmetic logic unit, a shifter, an operation register, an input register and an output register, each connected to an internal bus to provide a path for the transfer of data and each comprised of a plurality of MOSFETs,
wherein the connection of the at least one of said elements to said internal bus includes a buffer comprised of at least one bipolar transistor arranged to provide a direct connection between MOSFETs of said at least of said elements and other MOSFET circuits having inputs connected to said internal bus.

20. A semiconductor device comprising:
a drive line coupled to a predetermined load;
a bipolar transistor having a collector-emitter path coupled to said drive line to couple said drive line to a first predetermined potential, wherein a base of said bipolar transistor is coupled to receive a first control signal to control the coupling of said drive line to said first predetermined potential through said collector-emitter path to charge said drive line; and
a field-effect transistor having a source-drain path coupled to said drive line to couple said drive line to a second predetermined potential, wherein a gate of said field-effect transistor is coupled to receive a second control signal to control the coupling of said drive line to said second predetermined potential through said source-drain path to discharge said drive line,
wherein the bipolar transistor is arranged to provide a direct connection between the field-effect transistor and other field-effect transistor circuits coupled to said bipolar transistor.

21. A word line drive circuit for a semiconductor memory device comprising:

a plurality of word drive lines respectively coupled to predetermined word lines of a semiconductor memory;

a plurality of bipolar transistors respectively coupled to have collector-emitter paths coupled to corresponding word drive lines to couple said word drive lines to a first predetermined potential, wherein bases of said bipolar transistor are respectively coupled to receive first control signals to control the coupling of said word drive lines to said first predetermined potential through said collector-emitter paths to charge said word drive lines; and a plurality of field-effect transistors having source-drain paths respectively coupled to said word drive lines to couple said word drive lines to a second predetermined potential, wherein gates of said field-effect transistors are respectively coupled to receive second control signals to control the coupling of said word drive lines to said second predetermined potential through said source-drain paths to discharge said word drive lines, wherein said bipolar transistors are arranged to provide direct connections between the field-effect transistors and other field-effect transistor circuits to said bipolar transistors.

22. A word line drive circuit according to claim 21, wherein said plurality of field-effect transistors receive a common second control signal.

23. A semiconductor memory device comprising:

a memory cell array including a plurality of bit lines respectively coupled to predetermined memory cells in said semiconductor cell array;

a precharge circuit including a plurality of bipolar transistors respectively coupled to have collector-emitter paths coupled to corresponding bit lines to couple said bit lines to a first predetermined potential, wherein bases of said bipolar transistors are respectively coupled to receive first control signals to control the coupling of said bit lines to said first predetermined potential through said collector-emitter paths to charge said bit lines; and a discharge circuit including a plurality of field-effect transistors having source-drain paths respectively coupled to said bit lines to couple said bit lines to a second predetermined potential, wherein gates of said field-effect transistors are respectively coupled to receive second control signals to control the coupling of said bit lines to said second predetermined potential through said source-drain paths to discharge said bit lines, wherein said bipolar transistors are arranged to provide direct connections between the field-effect transistors and other field-effect transistor circuits to said bipolar transistors.

24. A semiconductor memory device according to claim 23, wherein said plurality of bipolar transistors are coupled to receive a common first control signal.

25. A semiconductor memory device according to claim 23, wherein each individual bit line is coupled to a plurality of said field-effect transistors of said discharge circuit, and wherein each of said plurality of field-effect transistors coupled to an individual bit line is coupled to receive a different second control signal than other field-effect transistors coupled to said individual bit line.

26. A semiconductor memory device according to claim 25, wherein said field-effect transistors of said discharge circuit are arranged to form an OR-array for discharging said bit lines.

27. A semiconductor memory device according to claim 20, wherein said second control signal will prevent said discharge of said drive line when said bipolar transistor is coupling said drive line to said first potential to charge said drive line.

28. A semiconductor memory device according to claim 21, wherein said second control signal will prevent said discharge of said drive line when said bipolar transistor is coupling said drive line to said first potential to charge said drive line.

29. A semiconductor memory device according to claim 20, wherein said second control signal will prevent said discharge of said drive line when said bipolar transistor is coupling said drive line to said first potential to charge said drive line.

30. A data processor according to claim 1, wherein the buffer is comprised of at least one bipolar transistor and at least one MOSFET, and wherein the bipolar transistor is selectively intermixed with the MOSFET to provide a combination that will have high speed and small size.

31. A data processor according to claim 30, wherein the buffer is comprised of a majority of MOSFETs.

32. A data processor according to claim 2, wherein the at least one bipolar transistor of the processing circuit is selectively intermixed with the MOSFETs of the processing circuit to provide a combination that will have high speed and small size.

33. A data processor according to claim 32, wherein the processing circuit is comprised of a majority of MOSFETs.

34. A data processor according to claim 3, wherein the buffer is comprised of at least one bipolar transistor and at least one MOSFET, and wherein the bipolar transistor is selectively intermixed with the MOSFET to provide a combination that will have high speed and small size.

35. A data processor according to claim 34, wherein the buffer is comprised of a majority of MOSFETs.

36. A data processor according to claim 4, wherein the buffer is comprised of at least one bipolar transistor and at least one MOSFET, and wherein the bipolar transistor is selectively intermixed with the MOSFET to provide a combination that will have high speed and small size.

37. A data processor according to claim 36, wherein the buffer is comprised of a majority of MOSFETs.

38. A data processor according to claim 5, wherein the bipolar transistor of the word line drive is selectively intermixed with the MOSFET of the word line drive to provide a combination that will have high speed and small size.

39. A data processor according to claim 38, wherein the buffer is comprised of a majority of MOSFETs.

40. A data processor according to claim 7, wherein the bipolar transistor of the address input buffer is selectively intermixed with the MOSFETs of the address input buffer to provide a combination that will have high speed and small size.

41. A data processor according to claim 40, wherein the address input buffer is comprised of a majority of MOSFETs.

42. A data processor according to claim 8, wherein the bipolar transistor of the word line driver is selectively intermixed with the MOSFET of the word line driver to provide a combination that will have high speed and small size.

43. A data processor according to claim 42, wherein the word line driver is comprised of a majority of MOSFETs.

44. A data processor according to claim 9, wherein the bipolar transistor of the precharge circuit is selectively intermixed with the MOSFET of the precharge circuit to provide a combination that will have high speed and small size.

45. A data processor according to claim 44, wherein the precharge circuit is comprised of a majority of MOSFETs.

46. A data processor according to claim 10, wherein the bipolar transistor of the sense circuit is selectively intermixed with the MOSFETs of the sense circuit to provide a combination that will have high speed and small size.

47. A data processor according to claim 46, wherein the sense circuit is comprised of a majority of MOSFETs.

48. A data processor according to claim 11, wherein the bipolar transistor of the output buffer is selectively intermixed with the MOSFETs of the output buffer to provide a combination that will have high speed and small size.

49. A data processor according to claim 48, wherein the output buffer is comprised of a majority of MOSFETs.

50. A data processor according to claim 12, wherein the buffer is comprised of at least one bipolar transistor and at least one MOSFET, and wherein the bipolar transistor is selectively intermixed with the MOSFET to provide a combination that will have high speed and small size.

51. A data processor according to claim 50, wherein the buffer is comprised of a majority of MOSFETs.

52. A data processor according to claim 13, wherein the buffer is comprised of at least one bipolar transistor and at least one MOSFET, and wherein the bipolar transistor is selectively intermixed with the MOSFET to provide a combination that will have high speed and small size.

53. A data processor according to claim 52, wherein the buffer is comprised of a majority of MOSFETs.

54. A data processor according to claim 14, wherein the buffer is comprised of at least one bipolar transistor and at least one MOSFET, and wherein the bipolar transistor is selectively intermixed with the MOSFET to provide a combination that will have high speed and small size.

55. A data processor according to claim 54, wherein the buffer is comprised of a majority of MOSFETs.

56. A data processor according to claim 15, wherein the buffer is comprised of at least one bipolar transistor and at least one MOSFET, and wherein the bipolar transistor is selectively intermixed with the MOSFET to provide a combination that will have high speed and small size.

57. A data processor according to claim 56, wherein the buffer is comprised of a majority of MOSFETs.

58. A data processor according to claim 16, wherein the buffer is comprised of at least one bipolar transistor and at least one MOSFET, and wherein the bipolar transistor is selectively intermixed with the MOSFET to provide a combination that will have high speed and small size.

59. A data processor according to claim 58, wherein the buffer is comprised of a majority of MOSFETs.

60. A data processor according to claim 17, wherein the buffer is comprised of at least one bipolar transistor and at least one MOSFET, and wherein the bipolar transistor is selectively intermixed with the MOSFET to provide a combination that will have high speed and small size.

61. A data processor according to claim 60, wherein the buffer is comprised of a majority of MOSFETs.

62. A data processor according to claim 18, wherein the buffer is comprised of at least one bipolar transistor and at least one MOSFET, and wherein the bipolar transistor is selectively intermixed with the MOSFET to provide a combination that will have high speed and small size.

63. A data processor according to claim 62, wherein the buffer is comprised of a majority of MOSFETs.

64. A data processor according to claim 19, wherein the buffer is comprised of at least one bipolar transistor and at least one MOSFET, and wherein the bipolar transistor is selectively intermixed with the MOSFET to provide a combination that will have high speed and small size.

65. A data processor according to claim 64, wherein the buffer is comprised of a majority of MOSFETs.

* * * * *